(12) United States Patent
Kajiyama

(10) Patent No.: US 9,972,796 B2
(45) Date of Patent: May 15, 2018

(54) DISPLAY DEVICE AND MANUFACTURING METHOD OF THE SAME

(71) Applicant: Japan Display Inc., Tokyo (JP)

(72) Inventor: Kenta Kajiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/284,572

(22) Filed: Oct. 4, 2016

(65) Prior Publication Data

US 2017/0221978 A1  Aug. 3, 2017

(30) Foreign Application Priority Data

Feb. 1, 2016 (JP) ................................ 2016-017059

(51) Int. Cl.
| | |
|---|---|
| H01L 27/32 | (2006.01) |
| H01L 51/00 | (2006.01) |
| H01L 27/12 | (2006.01) |
| H01L 29/423 | (2006.01) |

(52) U.S. Cl.
CPC ...... *H01L 51/0097* (2013.01); *H01L 27/1218* (2013.01); *H01L 27/1244* (2013.01); *H01L 27/1248* (2013.01); *H01L 29/42384* (2013.01); *H01L 2029/42388* (2013.01)

(58) Field of Classification Search
CPC ........... G02F 1/133305; G02F 1/13338; G02F 1/13452; G02F 2001/133311; G02F 2001/133325; G02F 2001/133331; G02F 2001/133388; G02F 2001/133391; G02F 2001/13456; G06F 1/1626; G06F 1/1643; G06F 1/1652
See application file for complete search history.

(56) References Cited

U.S. PATENT DOCUMENTS

| | | | | |
|---|---|---|---|---|
| 6,893,967 | B1 * | 5/2005 | Wright | H01L 29/6656 257/333 |
| 7,973,315 | B2 * | 7/2011 | Koo | H01L 27/12 257/59 |
| 8,736,162 | B2 * | 5/2014 | Jin | H01L 51/5253 313/483 |
| 2006/0043510 | A1 * | 3/2006 | Yamazaki | H01L 27/12 257/432 |

(Continued)

FOREIGN PATENT DOCUMENTS

JP         2013-15835 A        1/2013

*Primary Examiner* — William F Kraig
*Assistant Examiner* — Edward Chin
(74) *Attorney, Agent, or Firm* — TYPHA IP LLC

(57) ABSTRACT

Provided is a display device including: a first wiring over an insulating surface; a sidewall over the insulating surface and covering a side surface of the first wiring; an insulating film over the first wiring and the sidewall; and a second wiring over the insulating film, the second wiring intersecting with the first wiring, where an angle of a surface of the sidewall with respect to the insulating surface is smaller than an angle of the side surface of the first wiring with respect to the insulating surface. The angle increases with decreasing distance from the first wiring. An intersection portion of the first wiring and the second wiring is located in a display region of the display device and included in a bent portion of the display device when the display device is bent so that the first wiring is bent.

15 Claims, 14 Drawing Sheets

(56) References Cited

U.S. PATENT DOCUMENTS

| | | | |
|---|---|---|---|
| 2006/0255719 A1* | 11/2006 | Oikawa | H01L 51/5206 313/503 |
| 2010/0007829 A1* | 1/2010 | Oikawa | G02F 1/133305 349/122 |
| 2012/0241750 A1* | 9/2012 | Chikama | H01L 27/1225 257/71 |
| 2014/0027791 A1* | 1/2014 | Cho | H01L 33/44 257/88 |
| 2015/0108484 A1* | 4/2015 | Park | H01L 27/1255 257/71 |
| 2016/0365395 A1* | 12/2016 | Xu | H01L 51/5246 |
| 2017/0141179 A1* | 5/2017 | Kim | H01L 27/323 |
| 2017/0141349 A1* | 5/2017 | Kwak | H01L 51/56 |
| 2017/0155070 A1* | 6/2017 | Han | H01L 27/3209 |

\* cited by examiner

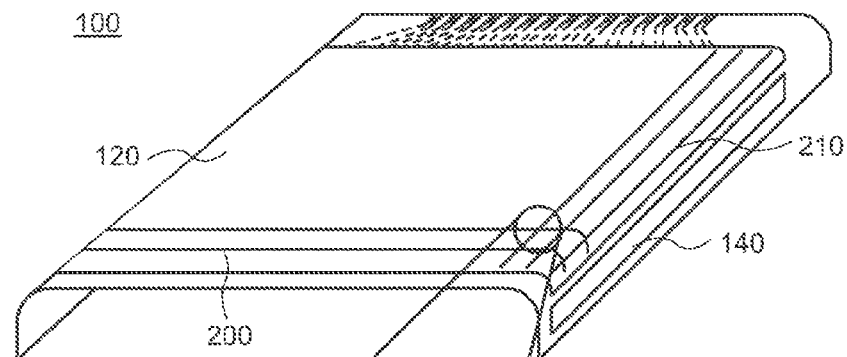
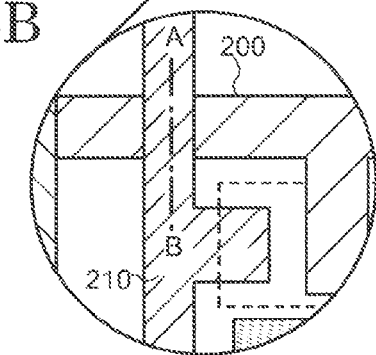
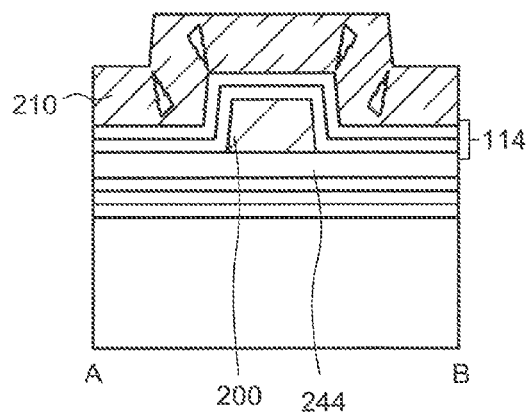
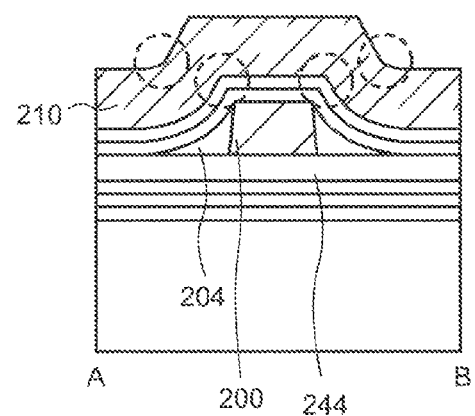

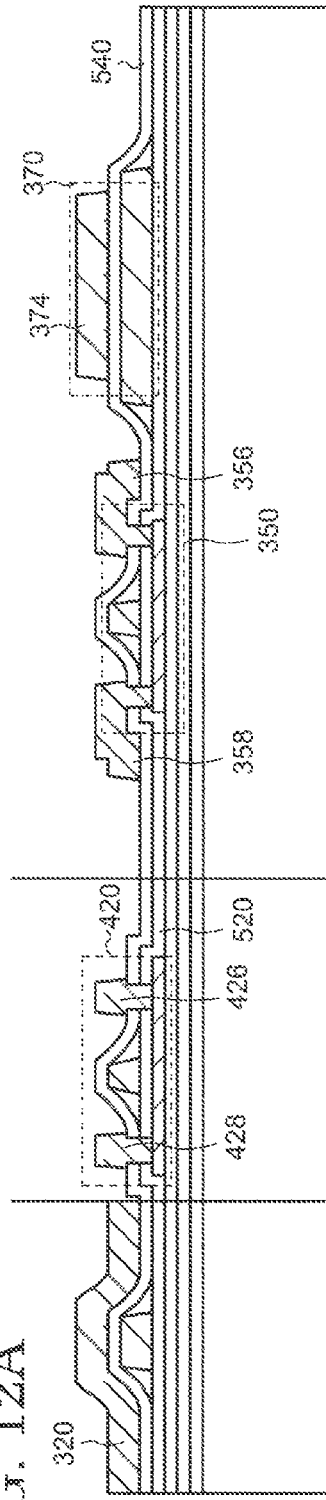
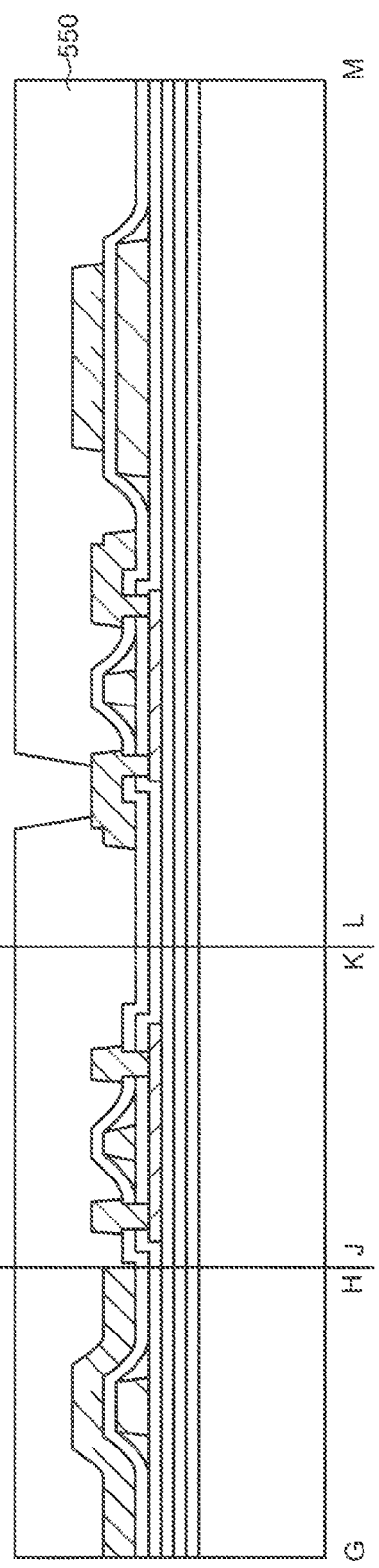
FIG. 12A
FIG. 12B

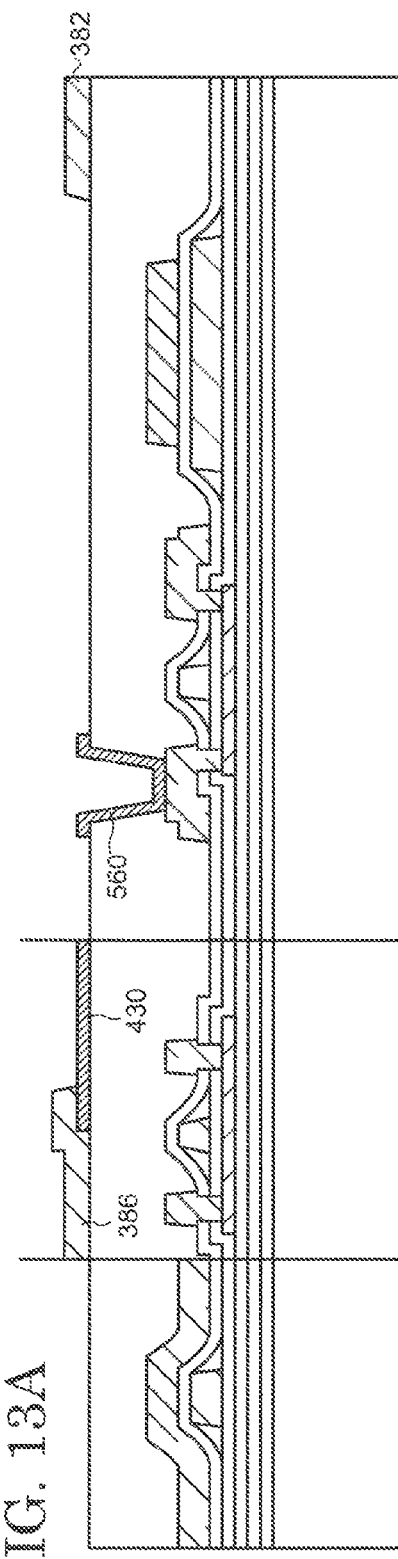
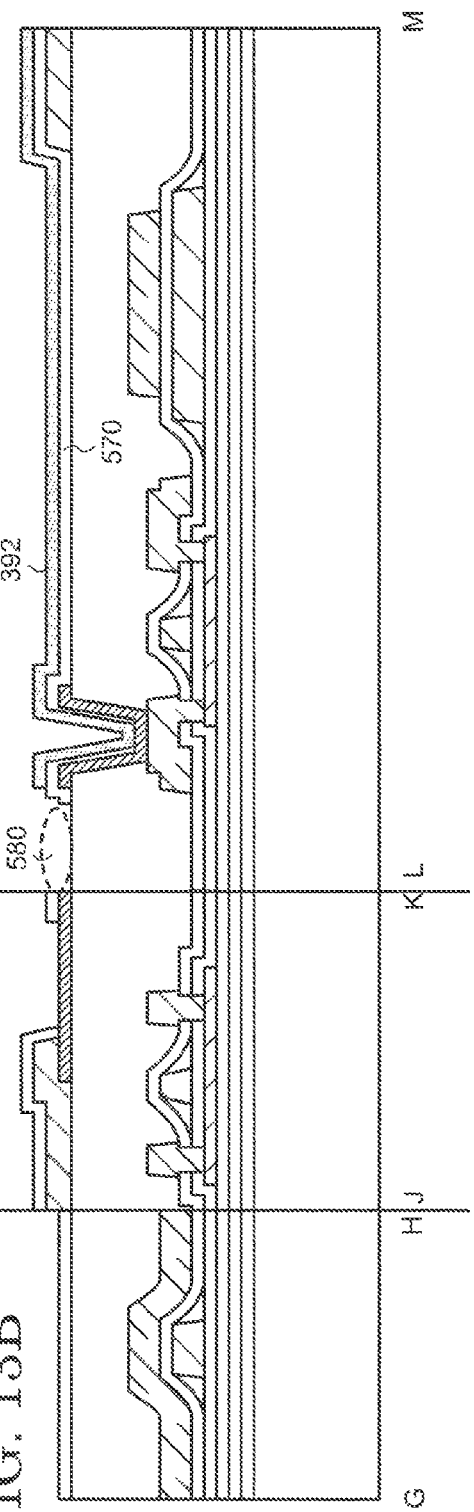

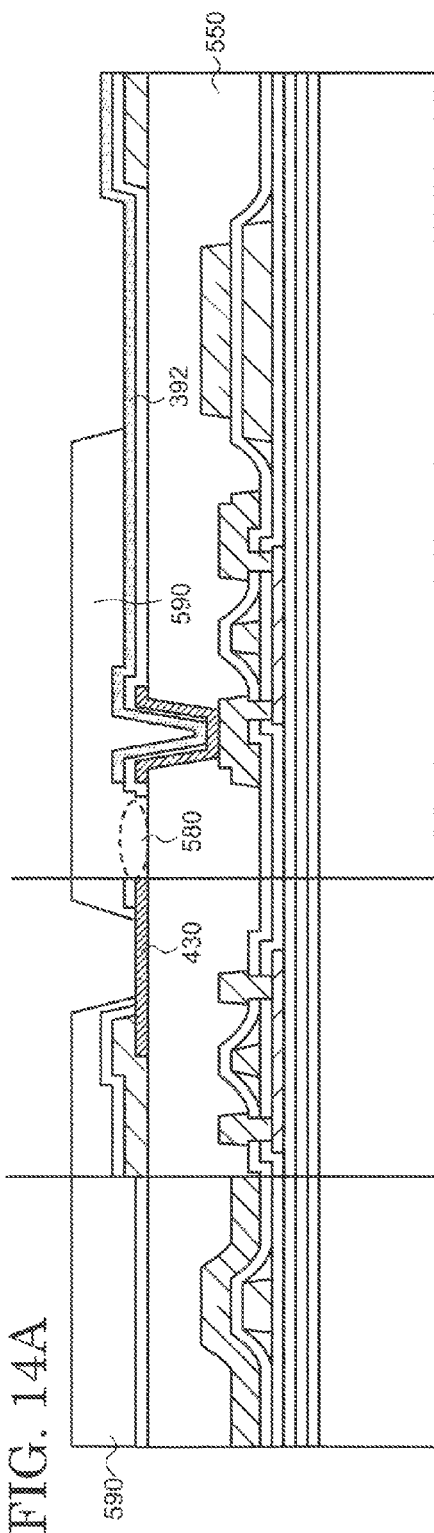
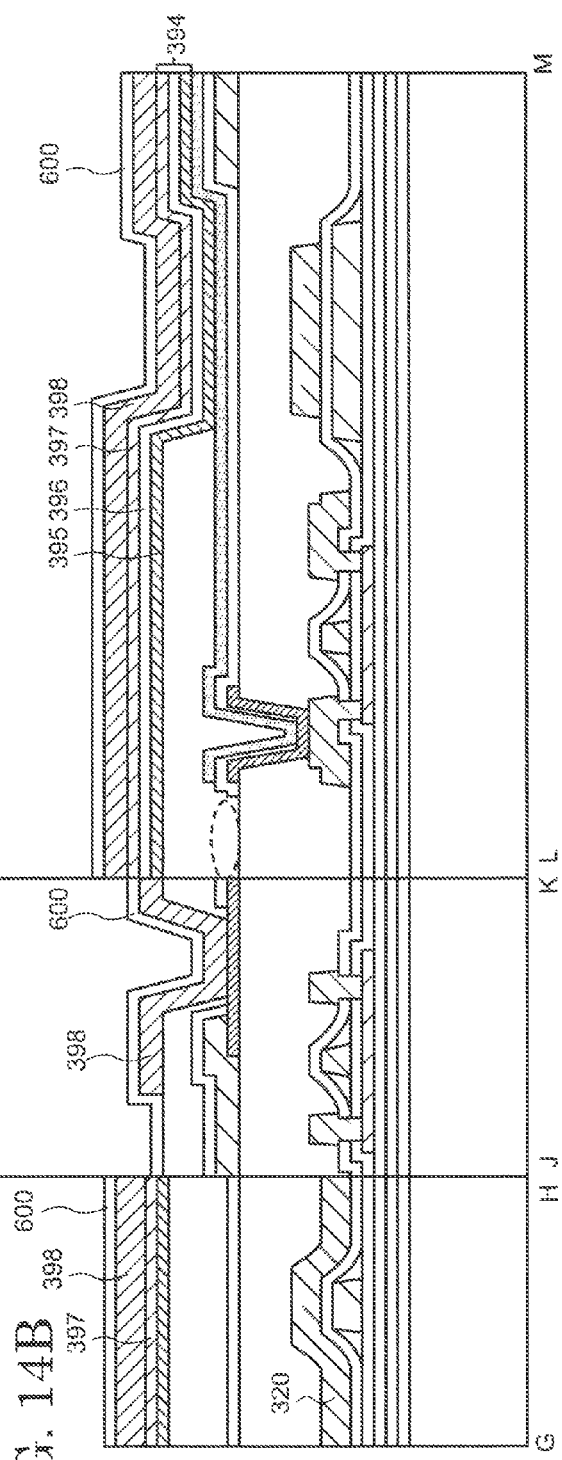

DISPLAY DEVICE AND MANUFACTURING METHOD OF THE SAME

CROSS REFERENCE TO RELATED APPLICATIONS

This application is based on and claims the benefit of priority from the prior Japanese Patent Application No. 2016-017059, filed on Feb. 1, 2016, the entire contents of which are incorporate herein by reference.

FIELD

The present invention relates to a display device and a manufacturing method of the display device. For example, the present invention relates to a flexible EL display device and its manufacturing method.

BACKGROUND

A liquid crystal display device and an EL (electroluminescence) display device which respectively have a liquid crystal element and a light-emitting element in each pixel are represented as a typical example of a display device. These display devices have display elements such as a liquid crystal element or an organic light-emitting element (hereinafter, referred to as a light-emitting element) in each of the plurality of pixels formed over a substrate. A liquid crystal element and a light-emitting element have a liquid crystal and a layer including an organic compound (hereinafter, referred to an organic layer), respectively, between a pair of electrodes and are operated by applying a voltage or supplying current between the pair of electrodes.

A light-emitting element is formed as a fully solid display element. Therefore, apart from a liquid crystal element, quality of display is not generally influenced even if a light-emitting element is provided with flexibility and folded or bent because a change in gap between the substrates does not cause any influence to an organic layer. This feature has been utilized to fabricate a so-called flexible display (sheet display) in which a light-emitting element is formed over a flexible substrate. For example, Japanese patent application publication No. 2013-15835 discloses a flexible organic EL display device which can be folded.

SUMMARY

A purpose of the present invention is to supply a display device having high reliability, such as a flexible organic EL display device, and its manufacturing method. Alternatively, a purpose of the present invention is to supply a flexible organic EL display device in which a display defect caused by damage of wiring when deformed is suppressed and a manufacturing method thereof.

An embodiment of the present invention is a display device including: a first wire over an insulating surface; a sidewall over the insulating surface and covering a side surface of the first wire; an insulating film over the first wire and the sidewall; and a second wire over the insulating film, the second wire intersecting with the first wire, where an angle of a surface of the sidewall with respect to the insulating surface is smaller than an angle of the side surface of the first wire with respect to the insulating surface.

An embodiment of the present invention is a display device including a pixel which includes: a gate line over an insulating surface; a sidewall over the insulating surface and covering a side surface of the gate line; and a signal line crossing over the gate line and the sidewall with an insulating film interposed between the signal line and the gate line and the sidewall, where an angle of a surface of the sidewall with respect to the insulating surface is smaller than an angle of the side surface of the gate line with respect to the insulating surface.

An embodiment of the present invention is a display device including: a display region over an insulating surface; and a driver circuit electrically connected to the display region. The display region includes: a gate line; a first sidewall covering a side surface of the gate line; a signal line crossing over the gate line and the first sidewall with an insulating film interposed between the gate line and the first sidewall and the signal line; and a light-emitting element electrically connected to the gate line and the signal line. The driver circuit includes: a transistor having a gate, a source, and a drain; a first wire electrically connected to the gate line; the insulating film over the gate; and a second wire over the insulating film, the second wire being electrically connected to one of the source and the drain and intersecting with the first wire substantially perpendicularly. An angle of a surface of the first sidewall with respect to the insulating surface is smaller than an angle of the side surface of the gate line with respect to the insulating film.

BRIEF DESCRIPTION OF DRAWINGS

FIG. 6A and FIG. 6B are a schematic perspective view of a display device, and FIG. 6C and FIG. 6D are a schematic cross-sectional view of a wire according to an embodiment;

FIG. 12A and FIG. 12B are a schematic view showing a manufacturing method of a display device according to an embodiment;

FIG. 13A and FIG. 13B are a schematic view showing a manufacturing method of a display device according to an embodiment; and FIG. 14A and FIG. 14B are a schematic view showing a manufacturing method of a display device according to an embodiment.

DESCRIPTION OF EMBODIMENTS

Figure 1:
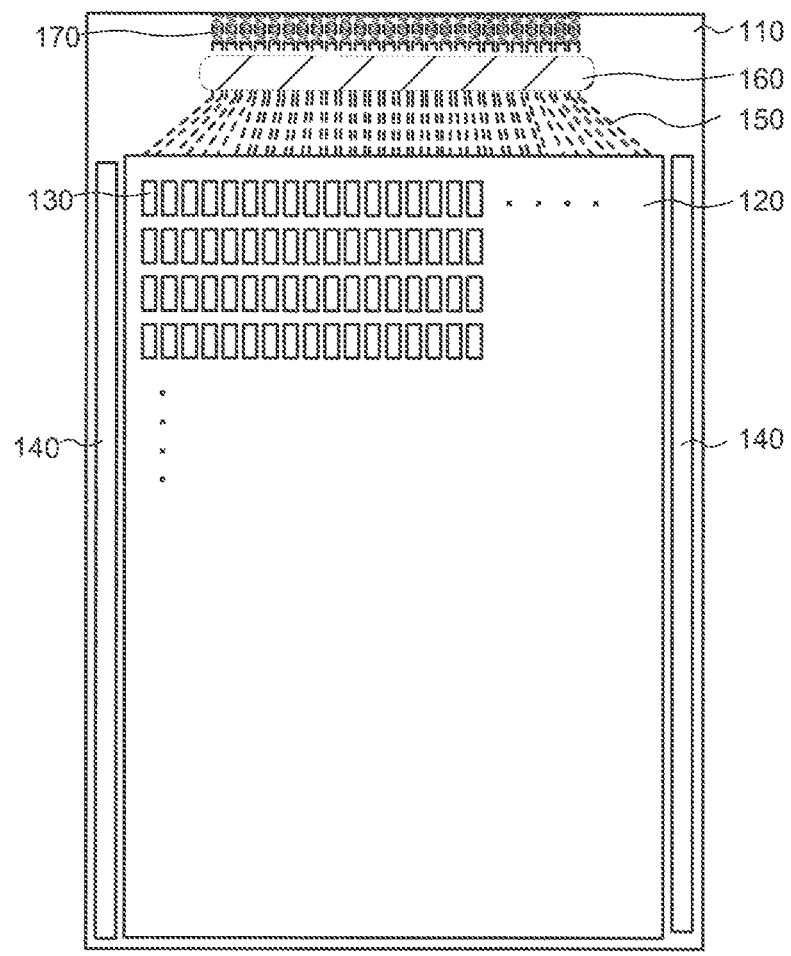
FIG. 1 is a schematic top view of a display device according to an embodiment.

Hereinafter, each embodiment of the present invention is explained with reference to the drawings. The invention can be implemented in a variety of modes within the scope of the concept and should not be interpreted as being limited to the disclosure of the following embodiments.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and a detailed explanation may be omitted as appropriate.

In the present invention, when plural films are formed by processing one film, these plural films may have functions or roles different from each other. However, these plural films originate from a film which is formed as the same layer in the same process. Therefore, these plural films are defined as films existing in the same layer.

In the invention, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

<Embodiment 1>

In the present embodiment, a display device according to an embodiment of the present invention is explained by using FIG. 1 to FIG. 7B.

A top view of the display device according to the present embodiment is shown in FIG. 1. The display device 100 has a display region 120 including a plurality of pixels 130 and a gate side driver circuit (hereinafter, referred to as a driver circuit) 140 over one surface (top surface) of a base substrate 110. The pixels 130 are arranged in a matrix form with m lines and n columns. Wiring 150 extends to a side surface of the base substrate 110 from the display region 120 and is exposed at a terminal portion of the base substrate 110. The exposed portions function as terminals 170 which are connected to a connector (not illustrated) such as a flexible printed circuit (FPC). Although two driver circuits 140 are disposed so as to sandwich the display region 120 in the present embodiment, the number of the driver circuits 140 may be one. Furthermore, the driver circuit 140 may not be disposed over the base substrate 110, and a driver circuit formed over a different substrate may be mounted over the connector.

The display region 120 is electrically connected to an IC chip 160 via the wiring 150. Image signals supplied from an external circuit are provided to the pixels 130 through the driver circuit 140 and the IC chip 160 so that the emission of the pixels 130 is controlled and an image is reproduced on the display region 120. The use of a film having flexibility as the base substrate 110 provides flexibility to the whole of the display device 100. A flexible base substrate is also called a base film. Note that, although not shown in the diagram, the display device 100 may have a source side driver circuit, for example, in a periphery of the display region 120 instead of the IC chip 160.

A light-emitting element 270 is disposed in each of the pixels 130. A full color display can be performed by arranging a red-emissive, a green-emissive, or a blue-emissive light-emitting element 270 in each pixel 130, for example. Alternatively, a white-emissive light-emitting element may be used in the all pixels 130, and red color, green color, or blue color may be extracted from the respective pixels 130 by using color filters. The colors finally extracted are not limited to the combination of red, green, and blue colors, and four kinds of colors including red, green, blue, and white colors may be extracted from the pixels 130. There is no limitation to the arrangement of the pixels 130, and a stripe arrangement, Pentile arrangement, mosaic arrangement, or the like can be employed.

Figure 2:
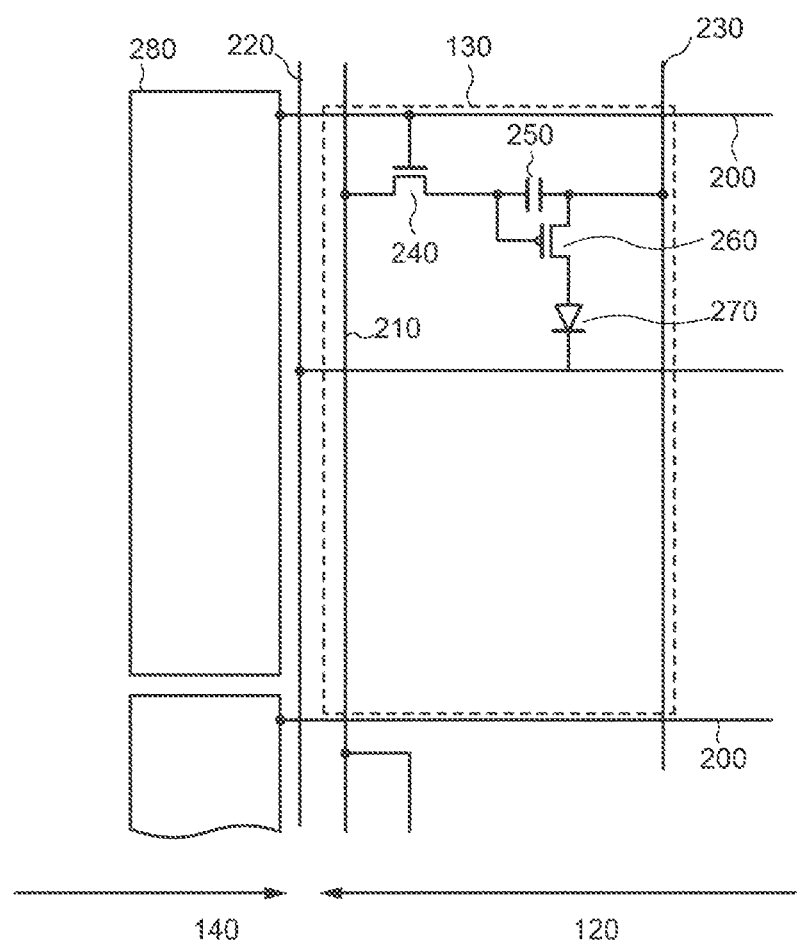
FIG. 2 is a circuit diagram of a pixel of a display device according to an embodiment.

A schematic view of the display region 120 including the pixels 130 and a part of the driver circuit 140 is shown in FIG. 2. As shown in FIG. 2, wiring such as a gate line 200, a signal line 210, a power source line 220, and a current-supplying line 230 are provided over the base substrate 110. The gate line 200 intersects with the signal line 210, the power source line 220, the current-supplying line 230, and the like. A region defined by the neighboring two gate lines 200, the signal line 210, and the current-supplying line 230 is one pixel 130. A part of this wiring may be shared by two or more adjacent pixels. For example, the current-supplying line 230 may be shared by both the pixel 130 and an adjacent pixel.

The pixel 130 shown in FIG. 2 has two transistors 240 and 260, a capacitor 250, and a light-emitting element 270. A gate, a drain, and a source of the transistor 240 are electrically connected to the gate line 200, the signal line 210, and a gate of the transistor 260, respectively. Both electrodes of the capacitor 250 are electrically connected to the drain of the transistor 240 and a source of the transistor 260, respectively. The source and a drain of the transistor 260 are electrically connected to the current-supplying line 230 and the light-emitting element, respectively. The light-emitting element is further connected to the power source line 220. Note that as a source and a drain of a transistor are interchangeable by the current direction or the polarity of the transistor, they can be called a first terminal or a second terminal. Therefore, in the claims, a source and a drain may be recited as a first terminal or a second terminal. The structure of the pixel 130 of the present embodiment is not limited to that shown in FIG. 2, and the pixel 130 may have a plurality of capacitors or three or more transistors. In such a case, wiring such as a reference power source line may be formed as appropriate. Additionally, the transistors included in the pixel may be any of a P-channel transistor or a N-channel transistor.

The driver circuit 140 has a shift register 280 corresponding to each line of the matrix, and the shift register 280 is electrically connected to the gate line 200 of the pixel 130 arranged in the line corresponding to the shift register 280. Although not shown in the diagram, the shift register 280 can include a plurality of transistors (second transistors). The power source line 220 may be arranged so as to overlap with the shift register 280 and may be arranged between the driver circuit 140 including the shift register 280 and the display region 120 as shown in FIG. 2.

Figure 3:
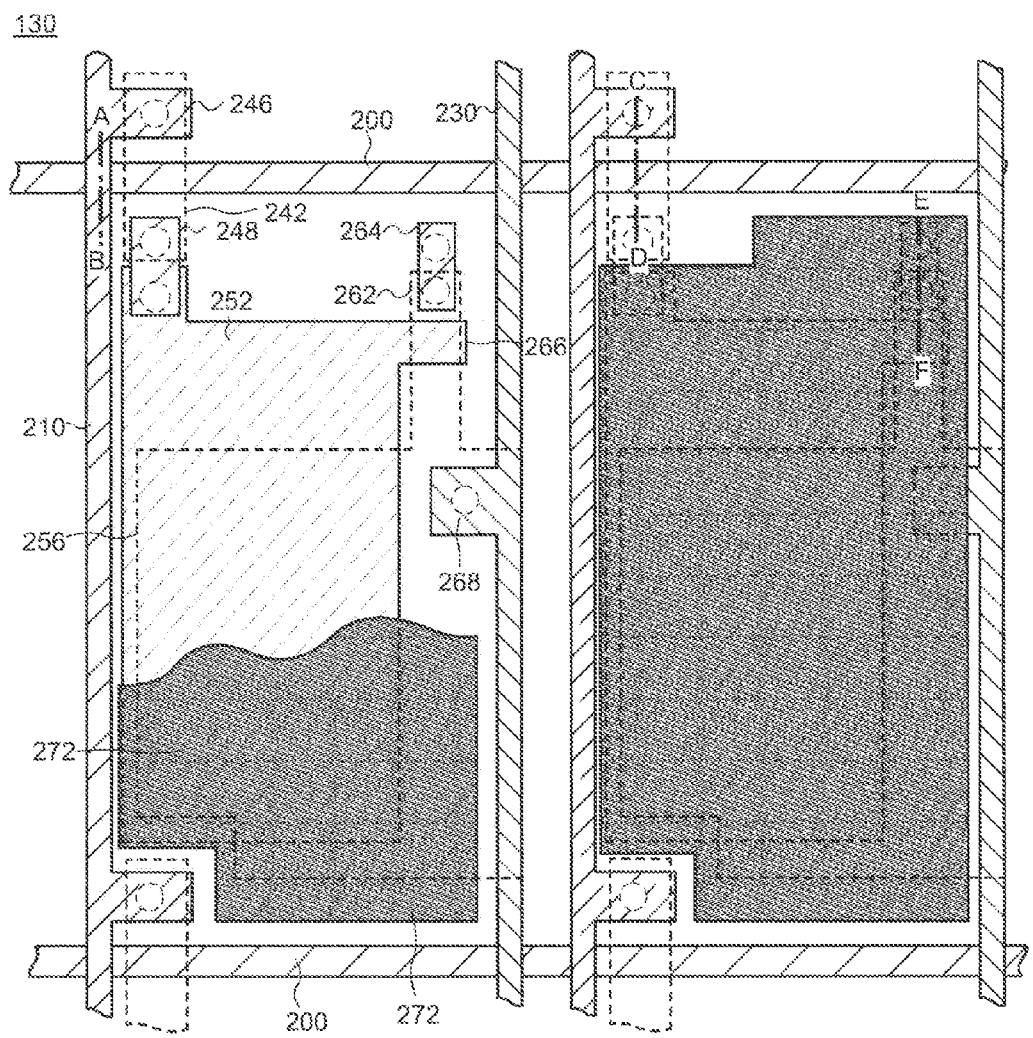
FIG. 3 is a schematic top view of a display device according to an embodiment.

A top view of two adjacent pixels 130 is shown in FIG. 3. Note that a part of one electrode (first electrode 272) of the light-emitting element 270 is omitted in the left pixel 130 in order to promote understanding. The transistor 240 has a semiconductor film 242, a part of the signal line 210 (a portion protruding rightward in the drawing) functions as the source 246 of the transistor 240, and a region of the gate line 200, which overlaps with the semiconductor film 242, functions as the gate of the transistor 240. One electrode (first capacitor electrode) 252 of the capacitor 250 is electrically connected to the drain 248 of the transistor 240. A part of the first capacitor electrode 252 functions as the gate 266 of the transistor 260. A part of the semiconductor film 262 of the transistor 260 functions as the other electrode (second capacitor electrode) 256 of the capacitor 250, and another part of the semiconductor film 262 forms a channel of the transistor 260. A part of the current-supplying line 230 (a portion protruding leftward in the drawing) functions as the source 268 of the transistor 260, and a current is supplied to the first electrode 272 of the light-emitting element 270 through the transistor 260. Here, the first electrode 272 is illustrated so as not to overlap with the signal line 210, the gate line 200, and the current-supplying line 230 in order to clearly understand the relationship between the structural elements in the drawings, but the area of the first electrode 272 may be increased so as to overlap with these elements.

Figure 4:
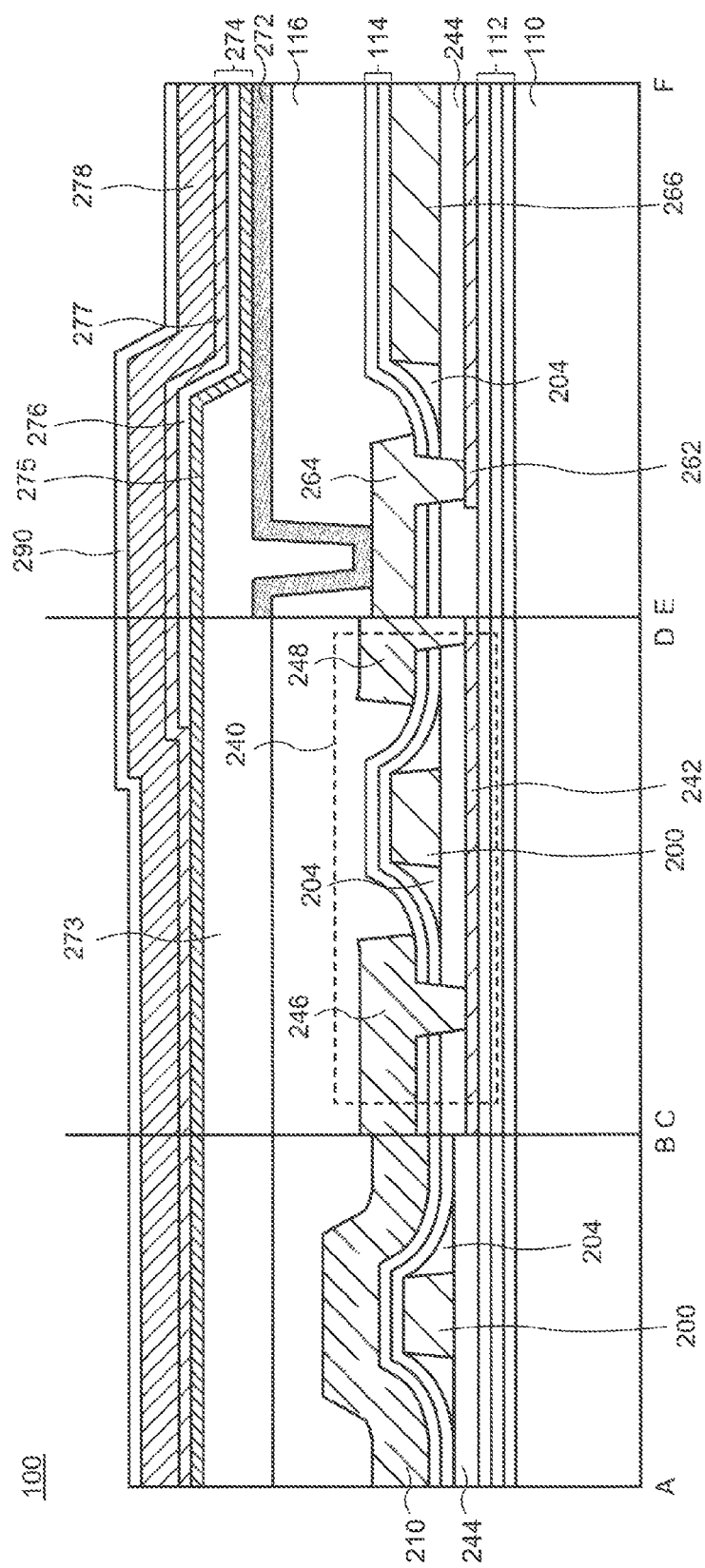
FIG. 4 is a schematic cross-sectional view of a display device according to an embodiment.

A schematic drawing including the cross-sections of lines A-B, C-D, and E-F in FIG. 3 is shown in FIG. 4. As shown in FIG. 4, the display device 100 has an undercoat film 112 over the base substrate 110. Although the undercoat film 112 has a three-layer structure in FIG. 4, the undercoat film 112 having a double or single layer structure may be used.

As shown in the cross-section of A-B, the gate line 200 is arranged over an insulating surface originating from a gate insulating film 244 included in the transistors 240 and 260. A protection film 114 which has a function to protect the transistors 240 and 260 is provided over the gate line 200, and the signal line 210 is disposed over the protection film 114. That is, the signal line 210 is arranged over the gate line 200 via the protection film 114 which is an insulating film so as to cross over the gate line 200. Although the protection film 114 has a two-layer structure in FIG. 4, the protection film 114 having a structure of three or more layers or a structure of a single layer may be used.

As shown in the cross-section C-D, the transistor 240 has the semiconductor film 242 over the undercoat film 112, and further possesses the gate line 200 functioning as the gate with the gate insulating film 244 therebetween. The protection film 114 is disposed over the gate line 200. Furthermore, the source 246 and the drain 248 are arranged over the protection film 114 and are electrically connected to the semiconductor film 242 in an opening passing through the protection film 114 and the gate insulating film 244. Note that although the transistors 240 and 260 are each illustrated as a top-gate type transistor in the present embodiment, they can also be a bottom-gate type transistor and may have a so-called multi-gate structure bearing a plurality of gates.

Referring to the cross-section E-F, the semiconductor film 262, the gate insulating film 244, and the gate 266 of the transistor 260 are arranged sequentially over the undercoat film 112. The protection film 114 and the drain 264 are provided over the gate 266, and the drain 264 is electrically connected to the semiconductor film 262 in an opening formed in the protection film 114 and the gate insulating film 244.

An interlayer insulating film 116 is disposed over these structures to absorb unevenness caused by the transistors 240 and 260 and the like and give a flat surface. The first electrode 272 of the light-emitting element 270 is arranged over the interlayer insulting film 116, and the first electrode 272 is electrically connected to the transistor 260 in an opening formed in the interlayer insulating film 116.

A partition wall 273 is arranged so as to cover an edge portion of the first electrode 272 and the opening in which the transistor 260 and the first electrode 272 are connected. The partition wall 273 has an opening to expose the first electrode 272, and an organic layer 274 is disposed over the partition wall 273 so as to be in contact with the first electrode 272 in the opening. A second electrode 278 of the light-emitting element 270 is provided over the organic layer 274. The light-emitting element 270 is structured by the first electrode 272, the organic layer 274, and the second electrode 278, and carriers injected from the first electrode 272 and the second electrode 278 undergo recombination in the organic layer 274 to give emission. Thus, a region in which the organic layer 274 is in direct contact with the first electrode 272 is an emission region.

Although three layers of a first layer 275, a second layer 276, and a third layer 277 are stacked in the organic layer 274 in the structure shown in FIG. 4, the structure of the organic layer 274 is not limited to this structure, and four or more layers may be stacked. For example, a charge injection layer, a charge-transporting layer, a charge-blocking layer, an emission layer, and the like may be combined appropriately to configure the organic layer 274. In FIG. 4, the first layer 275 and the third layer 277 are formed as a charge-transporting layer and cover the plurality of pixels 130, and the second layer 276 is individually arranged as the emission layer in every pixel 130. Hence, the display device can be configured so that the structures of the second layer 276 are different between adjacent pixels 130. Note that the organic layer 274 having the same structure may be arranged over the plurality of pixels 130.

A protection film 290 (passivation film) for protecting the light-emitting element 270 is disposed over the second electrode 278. Although not shown, an opposing substrate may be provided over the protection film 290 with a fill material therebetween. A desiccant may be mixed with the fill material. Furthermore, a color filter, a light-shielding film, an overcoat film for protecting the color filter and the light-shielding film, and the like may be provided to the opposing substrate. Additionally, an adhesion to fix the opposing substrate may be disposed in a periphery of the display region 120.

Here, as shown in FIG. 4, in the display device 100 is arranged a sidewall 204 covering a side surface of the gate line 200 as well as side surfaces of the gate 266 of the transistors 260 and the first capacitor electrode 252, which exist in the same layer as the gate line 200.

Here, an angle ($\theta_s$) of a side surface of the sidewall 204 with respect to the insulating surface (i.e., a surface of the gate insulating film 244 in this case) is smaller than an angle ($\theta_g$) of the side surface of the gate line 200. Specifically, as shown in the cross-section A-B in FIG. 5A, the angle $\theta_g$ of the side surface of the gate line 200 with respect to the insulating surface S of the gate insulating film 244 is smaller than 90°, and the angle $\theta_s$ of the surface of the sidewall 204 with respect to the insulating surface S (i.e., an angle between a tangent in contact with the surface of the sidewall 204 and the insulating surface S) is smaller than $\theta_g$.

Figure 5A:
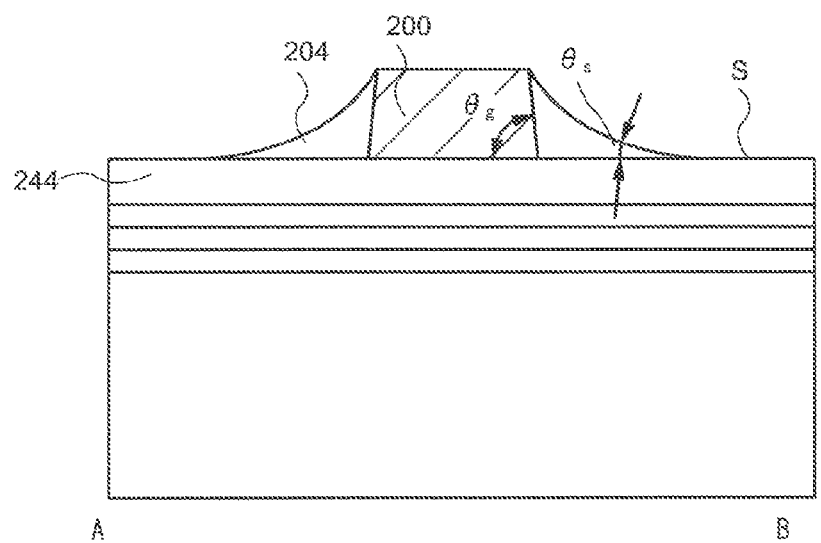
FIG. 5A and FIG. 5B are a schematic cross-sectional view of a display device according to an embodiment.
Figure 5B:
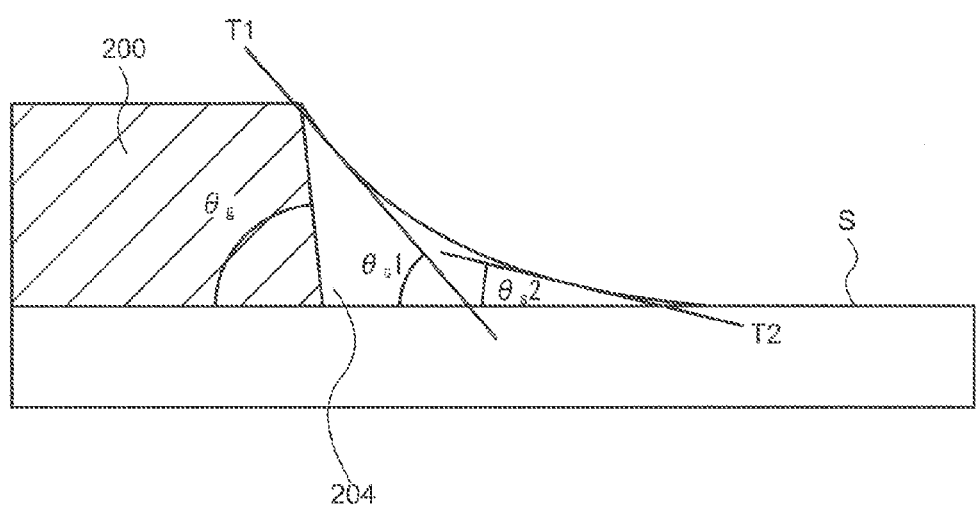

Moreover, $\theta_s$ increases with decreasing distance from the gate line 200. Specifically, as shown in FIG. 5B, in a comparison between tangents $T_1$ and $T_2$ which are in contact with the surface of the sidewall 204, an angle $\theta_{s1}$ between the tangent $T_1$ having a small distance from the gate line 200 and the surface S is larger than an angle $\theta_{s2}$ between the tangent $T_2$ having a large distance from the gate line 200 and the surface S.

The sidewall 204 preferably includes an insulator. As an insulator, a material having a small dielectric constant is represented. For example, an organic material can be used for the sidewall 204, and a polymer material such as an acrylic resin, a polyimide, a polysiloxane, and a polyester may be involved as the organic material. However, an inorganic compound may be used as long as the aforementioned configuration can be provided.

As described above, the use of a flexible base substrate 110 provides flexibility to the display device 100 and allows the display device 100 to be bent. For example, as shown in FIG. 6A, the display region 120 may be bent so that the gate line 200 is bent (see FIG. 6B). In this case, an intersection portion of the gate line 200 with the signal line 210 is included in the bent portion of the display device 100. As the configuration of the gate line 200 is reflected in the layers (protection film 114 and signal lines 210) formed over the gate line 200, the configuration of the protection film 114 and the signal line 210 changes markedly around the gate line 200 if the sidewall 204 is not provided as shown in FIG. 6C. For example, the surfaces of the protection film 114 and the signal line 210 form a large projection around the gate line 200. Due to this projection, the angle of the surface of the signal line 210 is steep in the region where the signal line 210 crosses over the gate line 200. That is, in a view from a cross-sectional direction, the signal line 210 is bent sharply. In this case, when the display device 100 is bent so that the gate line 200 is bent, a strain resulting from the bend is concentrated on the portion that changes in configuration sharply (the region indicated by the arrow in the drawing), and a large stress is applied on this portion. Therefore, repetition of the bend readily causes destruction of the signal line 210, leading to disconnection. Furthermore, the signal line 210 and the protection 114 are readily peeled off, resulting in a decrease in reliability.

On the other hand, as shown in a region surrounded by a circle in FIG. 6D, the formation of the sidewall 204 relaxes the configuration changes of the protection film 114 and the signal line 210 due to the gate line and delocalizes the strain caused by the bend. Thus, the disconnection of the signal line 210 can be suppressed, and the peeling of the signal line 210 and the protection film 114 can be prevented. Accordingly, a flexible display with high reliability can be provided.

Although an apparent width of the gale line 200 is increased by the formation of the sidewall 204, the sidewall 204 itself does not generate a parasitic capacitance or provide any adverse influence such as a signal delay due to parasitic capacitance because the sidewall 204 of the present embodiment can include an insulating material such as a polymer material as described above.

Figure 7A:
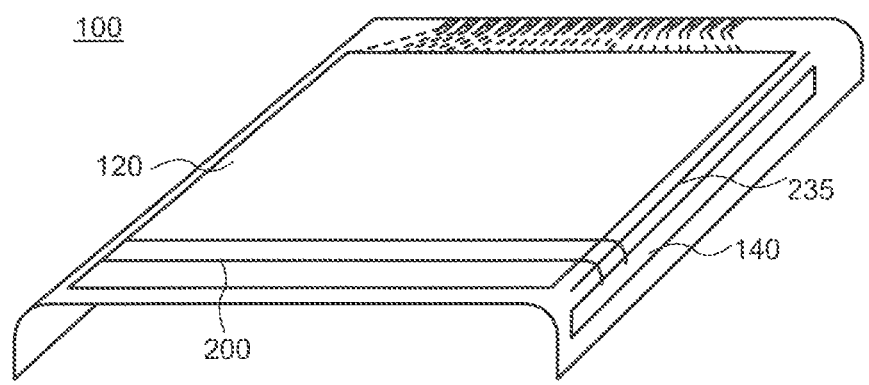
FIG. 7A and FIG. 7B are a schematic perspective view of a display device according to an embodiment.
Figure 7B:
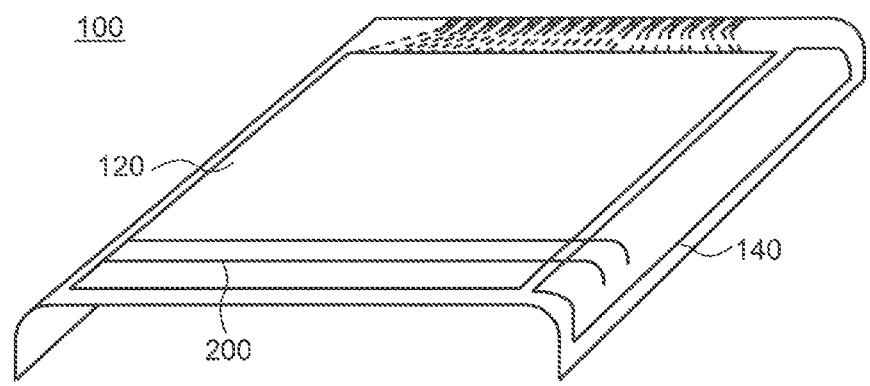

In FIG. 6A, an example is shown in which the display device 100 is bent in the display region 120, and the intersection portion of the gate line 200 with the signal line 210 is included in the bent portion. However, the bending mode of the display device 100 is not limited to this example, and a region between the display region 120 and the driver circuit 140 may be bent without bending the display region 120 as shown in FIG. 7A, for example. Alternatively, as shown in FIG. 7B, the display device 100 may be bent so that the bent portion is not provided in the display region 120 but provided in the driver circuit 140. Wiring such as a reference power source line 235 is formed over the protection film 114. Hence, the reference power source line 235 has a projection due to the gate line 200. However, the formation of the sidewall 204 so as to cover the side surface of the gate line 200 allows the configuration change of the projection to be relaxed. Accordingly, even if the driver circuit 140 is bent as shown in FIG. 7A, disconnection and peeling of the wiring such as the reference power source line 235 can be prevented, leading to an increase in reliability of the display device.

Wiring existing in the same layer as the gate line intersects with wiring existing in the same layer as the signal line 210 over the protection film 114 in the driver circuit 140 as described in Embodiment 2. In this case, the configuration change of the projection of the wiring existing in the same layer as the signal line 210 is also relaxed by forming the sidewall 204 so as to cover a side surface of the wiring existing in the same layer as the gate line 200. Accordingly, disconnection and peeling of the wiring can be prevented, and the reliability of the display device can be increased even if the driver circuit 140 is bent as shown in FIG. 7B.

The structure described in the present embodiment can be applied to not only stacked wiring included in a display device but also stacked wiring included in a variety of electronic devices having a region in which two wires intersect with an insulating film therebetween, which is exemplified by stacked wiring included in an FPC, a printed wiring substrate on which a semiconductor chip is mounted, and the like.

<Embodiment 2>

In the present embodiment, a display device 300 having a structure different from that of the display device 100 explained in Embodiment 1 is explained with reference to FIG. 8 to FIG. 10. Explanation of the structures which are the same as those of Embodiment 1 is omitted.

The display device 300 of the present embodiment has a display region 120 and a driver circuit 140. The display region 120 has pixels 400 which include transistors 340, 350, and 360, a capacitor 370, a supplement capacitor 380, and a light-emitting element 390. A shift register 410 is included in the driver circuit 140.

A gate and a source of the transistor 340 are electrically connected to a first gate line 310 and a signal line 320, respectively, and a drain thereof is electrically connected to one electrode of the capacitor 370 and a gate of the transistor 350. A source and a drain of the transistor 350 are electrically connected to a drain of the transistor 360 and the light-emitting element 390, respectively. A gate and a source of the transistor 360 are electrically connected to a second gate line 315 and a current-supplying line 330, respectively. The other electrode of the capacitor 370 is electrically connected to the light-emitting element 390. Both electrodes of the supplement capacitor 380 are electrically connected to the current-supplying line 330 and the light-emitting element 390, respectively. The light-emitting element 390 is further connected to a power source line 430 electrically. The first gate line 310 and the second gate line 315 intersect with the signal line 320, the current-supplying line, and the power source line 430.

Figure 8:
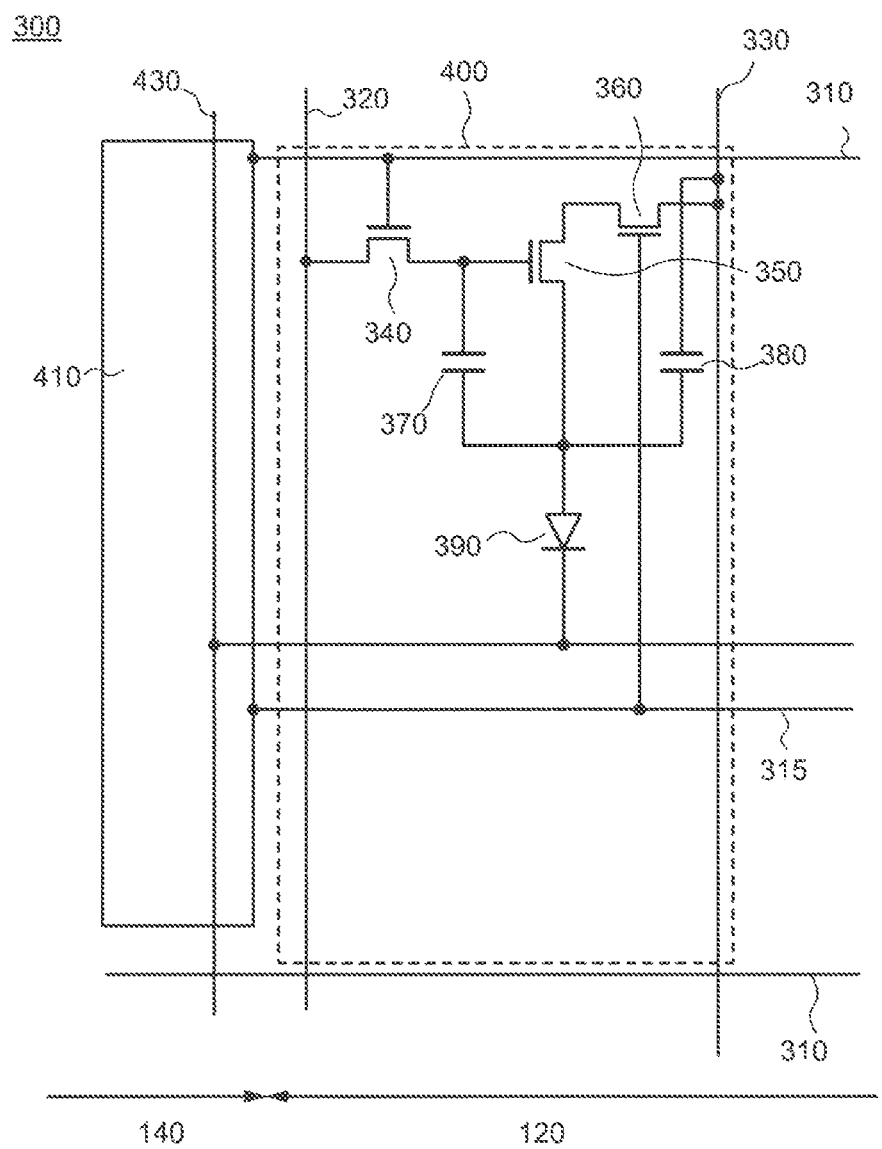
FIG. 8 is a circuit diagram of a pixel of a display device according to an embodiment.

Although not shown in FIG. 8, the shift register 410 may include a plurality of transistors (second transistors). The power source line 430 is arranged so as to overlap with the shift register 410. Note that the power source line 430 may be disposed between the driver circuit 140 including the shift register 410 and the display region 120.

Figure 9:
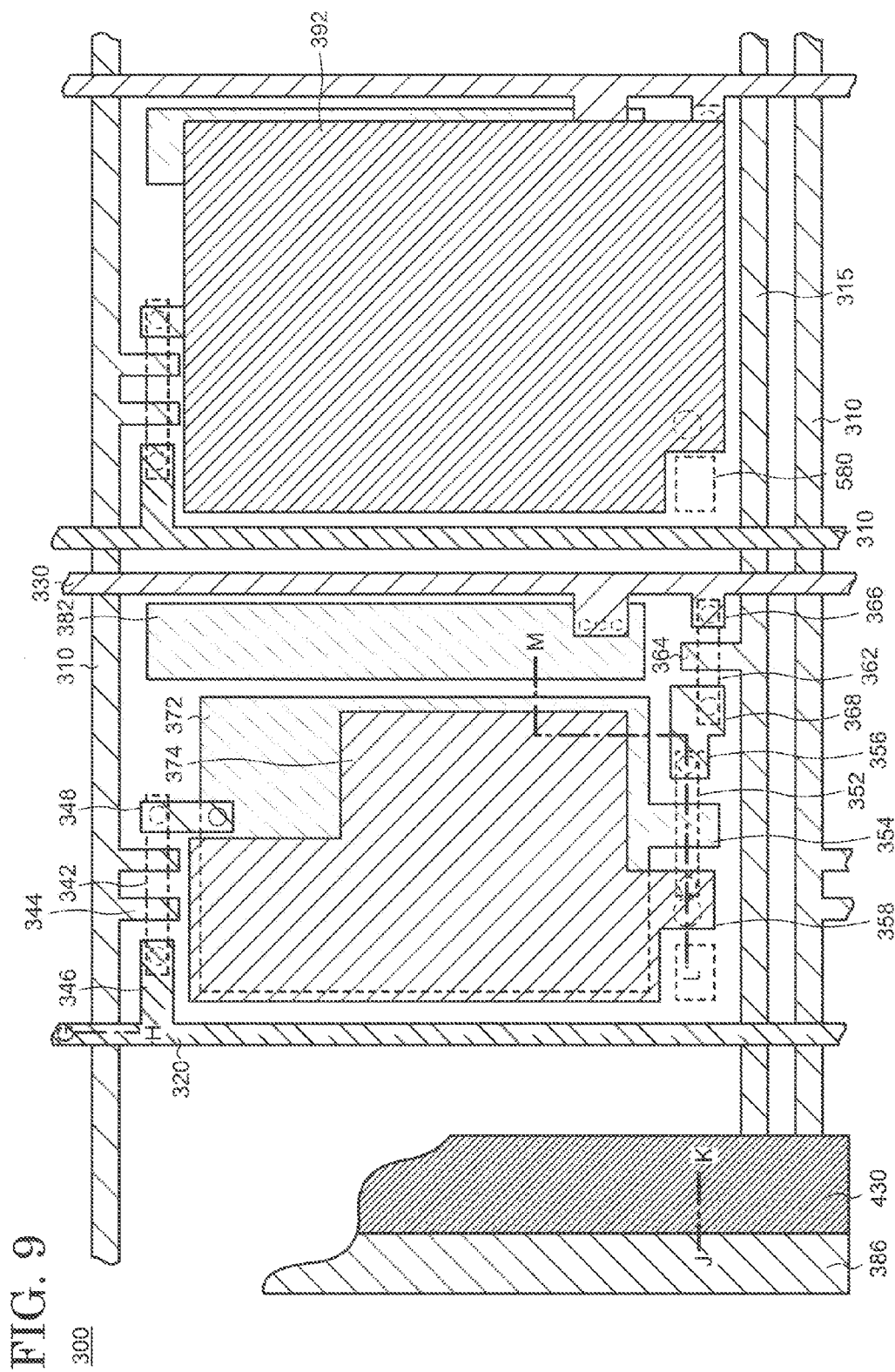
FIG. 9 is a schematic top view of a display device according to an embodiment.

A top view of the two adjacent pixels 400 and the power source line 430 is shown in FIG. 9. One electrode (first electrode 392) of the light-emitting element 390 and a part of the power source line 430 are omitted in the left pixel 400 in order to promote understanding. The transistor 340 has a semiconductor film 342, and a part of the signal line 320 (a portion protruding rightward in the drawing) functions as the source 346 of the transistor 340. On the other hand, a portion of the gate line 310, which protrudes downward, functions as the gate 344 of the transistor 340. Although the transistor 340 has a so-called double-gate structure having two gates 344 in FIG. 9, a transistor having a single gate may be employed. The semiconductor film 342 is electrically connected to the drain 348, and the drain 348 is electrically connected to one electrode 372 of the capacitor 370. The other electrode 374 of the capacitor 370 is formed so as to overlap with the electrode 372, and a part thereof functions as the drain 358 of the transistor 350. The transistor 350 is electrically connected to the drain 368 of the transistor 360 through the source 356. Here, the semiconductor films of the transistor 350 and the transistor 360 may be formed so as to extend to and connect to each other. A part of the second gate line 315 functions as the gate 364 of the transistor 360. The electrical power supplied from the current-supplying line 330 is supplied to the transistor 350 through the source 366, the semiconductor film 362, and the drain 368 of the transistor 360 and further supplied to the first electrode 392 of the light-emitting element 390. Here, the first electrode 392 is illustrated so as not to overlap with the signal line 320, the first gate line 310, the current-supplying line 330, transistor 342, and the like in order to clearly understand the relationship between the structural elements in the drawings. However, the area of the first electrode 392 may be increased so as to overlap with these elements.

Figure 10:
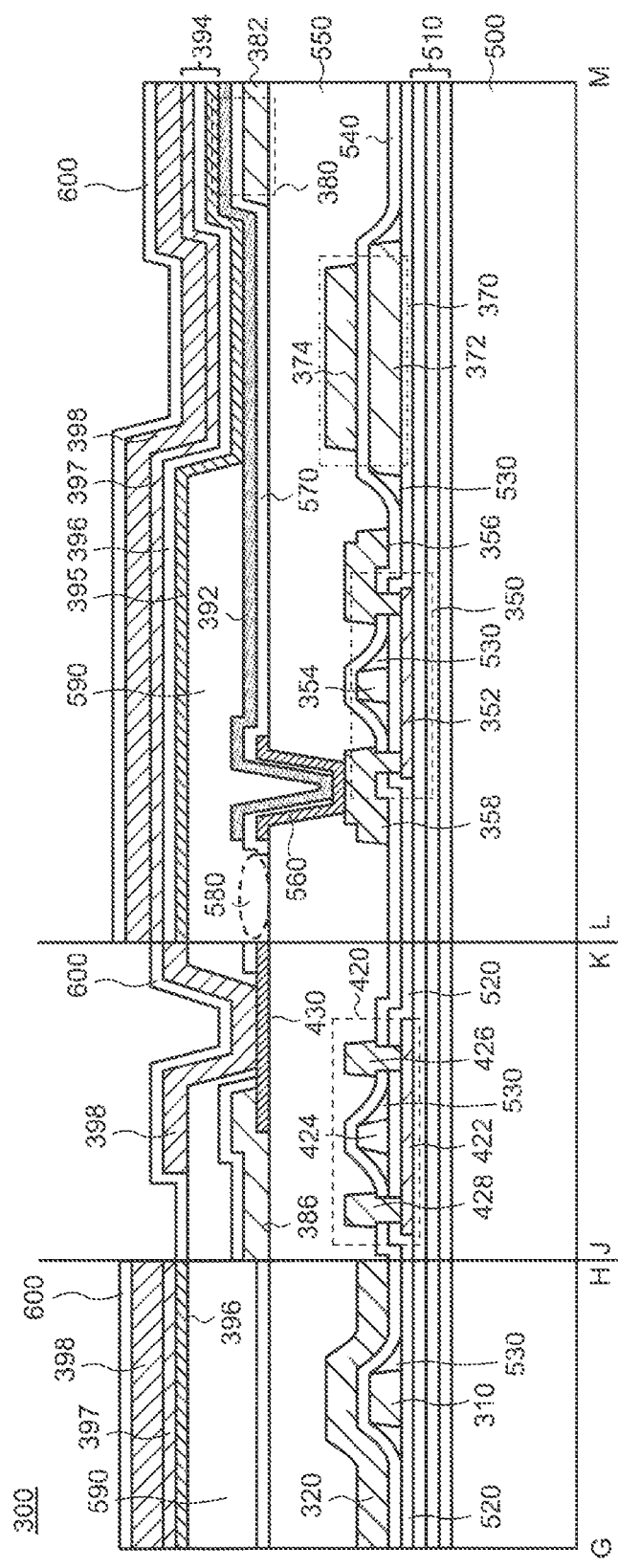
FIG. 10 is a schematic cross-sectional view of a display device according to an embodiment.

The cross-sectional views along lines G-H, J-K, and L-M are shown in FIG. 10. As shown in FIG. 10, the display device 300 has an undercoat film 510 over a base substrate 500, and a transistor 420 arranged in the shift register 410, the transistor 350, capacitor 370, and the supplement capacitor 380 arranged in the pixel 400 are formed over the undercoat film 510.

Specifically, referring to the cross-section G-H, the undercoat film 510 and a gate insulating film 520 included in the transistor 420 and the like are disposed over the base substrate 500, and the gate line 310 is formed thereover. A protection film 540 is arranged over the gate line 310 so as to cross over the gate line with the protection film 540 interposed therebetween.

On the other hand, as shown in the cross-section J-K, the transistor 420 (second transistor) is included in the shift register 410 which overlaps with the power source line 430. That is, a semiconductor film 422, the gate insulating film 520, a gate 424, a source 426, and a drain 428 of the transistor 420 are arranged over the undercoat film 510. The protection film 540 is formed over these structures. The source 426 and the drain 428 are electrically connected to the semiconductor film 422 in an opening portion formed in the protection film 540 and the gate insulating film 520.

Furthermore, a contact portion for electrical connection of a second electrode 398 of the light-emitting element 390 with the power source line 430 may be provided in a peripheral region in which the driver circuit 140 and the like are formed, that is, provided in a region outside the display region 120, by which a desired potential can be supplied to the second electrode 398 formed on the upper layer side of the light-emitting element 390.

Referring to the cross-section L-M, the transistor 350 has the semiconductor film 352, the gate insulating film 520, the gate 354, the source 356, and the drain 358. The protection film 540 is formed over these structures. The source 356 and the drain 358 are electrically connected to the semiconductor film 352 in an opening portion formed in the protection film 540 and the gate insulating film 520. The electrode 372 which exists in the same layer as the gate 354 is further arranged over the gate insulating film 520. The electrode 372 forms the capacitor 370 with the electrode 374 which is formed over the first electrode 372 with the protection film 540 therebetween and exists in the same layer as the source 356 and the drain 358.

Over the transistor 350, the capacitor 370, and the transistor 420 is arranged an interlayer insulating film 550 which absorbs unevenness caused by these elements and provides a flat surface. An opening portion which reaches the drain 358 of the transistor 350 is formed in the interlayer insulating film 550, and a connection electrode 560, an insulating film 570, and the first electrode 392 of the light-emitting element 390 are sequentially formed in the opening portion. This structure allows the first electrode 392 to be electrically connected to the transistor 350.

As shown in the cross-section L-M, an electrode 382 is further disposed over the interlayer insulating film 550. The electrode 382 is covered by the first electrode 392 with the insulating film 570 interposed therebetween, and the supplement capacitor 380 is formed by the electrode 382, the insulating film 570, and the first electrode 392.

Referring to the cross-section J-K, the power source line 430 existing in the same layer as the connection electrode 560 and a wire 386 existing in the same layer as the electrode 382 are formed over the interlayer insulating film so as to cover an edge portion of the power source line 430. A partition wall 590 is further formed so as to cover edge portions of the first electrode 392, the power source line 430, and the wire 386.

Here, as shown in the cross-section L-M, a part of the insulating film 570 covering the connection electrode 560 has an opening 580 reaching the interlayer insulating film 550 in which the interlayer insulating film 550 is in contact with the partition wall 590. The opening portion 580 functions as an opening for transferring impurities (water or gas such as oxygen) eliminated from the interlayer insulating film 550 to the side of the partition wall 590.

The partition wall 590 has an opening portion to expose the first electrode 392, and an organic layer 394 is disposed over the partition wall 590 so as to be in contact with the first electrode 392 in the opening portion. The second electrode 398 of the light-emitting element 270 is formed over the organic layer 394. Similar to Embodiment 1, the organic layer 394 possesses a first layer 395, a second layer 396, and a third layer 397, and the first layer 395 and the third layer 397 are formed so as to extend over the plurality of pixels 400. On the other hand, the second layer 396 is individually formed in every pixel 400. Note that, as described in Embodiment 1, the structure of the organic layer 394 is not limited to the aforementioned structure.

A protection film 600 for protecting the light-emitting element 390 is disposed over the second electrode 398. Although not shown in the diagram, an opposing substrate may be arranged over the protection film 600 with a fill material interposed therebetween similar to Embodiment 1. A desiccant may be mixed with the fill material. Furthermore, a color filter, a light-shielding film, an overcoat film for protecting the color filter and the light-shielding film, and the like may be provided to the opposing substrate. Additionally, an adhesion to fix the opposing substrate may be disposed in a periphery of the display region 120.

As shown in FIG. 10, in the display device 300 of the present embodiment, a sidewall 530 is provided so as to cover side surfaces of the gate line 310, the gate 354 of the transistor 350, the gate 424 of the transistor 420, and the electrode 372 of the capacitor 370, which exist in the same layer as the gate line 310. The material and the configuration of the sidewall 530 are the same as those of the sidewall 204 described in Embodiment 1.

As described in Embodiment 1, it is possible to relax the configuration change of the protection film 540 and the signal line 320 and delocalize the strain due to the bend as shown in the cross-section G-H. This feature enables the suppression of the disconnection of the signal line 320 and prevention of peeling of the signal line 320 and the protection film 540. On the other hand, as shown in the cross-section J-K, the transistor 420 included in the driver circuit 140 has the gate 424, and a wire which is formed over the gate 424 with the protection film 540 interposed therebetween, which overlaps with the gate 424, and which is electrically connected to one of the source 426 and the drain 428, has a protrusion caused by the gate 424. However, similar to the structure shown in the cross-section G-H, the sidewall 530 is formed on the side surface of the gate 424 by which the configuration change of the protrusion can be relaxed, and the strain due to the bend can be delocalized. As a result, a flexible display device having highly reliability can be supplied.

<Embodiment 3>

In this embodiment, a manufacturing method of the display device 300 shown in Embodiment 2 is explained referring to drawings FIG. 11A to FIG. 14B. Explanation of the structures which are the same as those of Embodiments 1 and 2 is omitted.

Figure 11A:
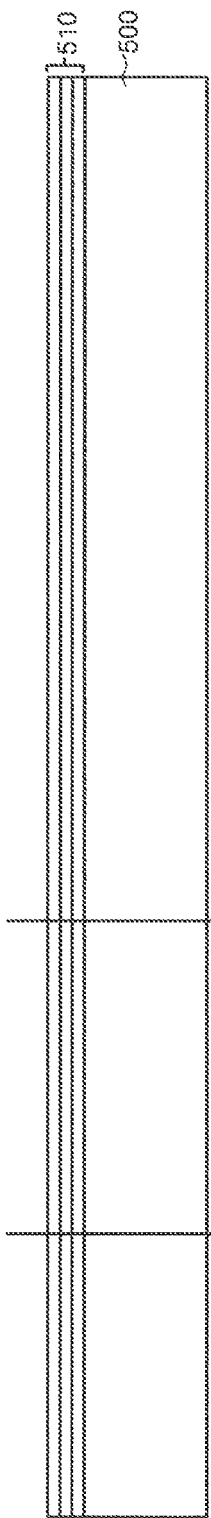
FIG. 11A to FIG. 11C are a schematic view showing a manufacturing method of a display device according to an embodiment.

First, as shown in FIG. 11A, the undercoat film 510 is formed over the base substrate 500. As a material usable for the base substrate 500, glass, quartz, a metal, and the like are represented. When flexibility is provided to the display device 300, a polymer material such as a polyimide, a polyester, and an acrylic resin can be used, for example. The undercoat film 510 may include an inorganic material such as silicon oxide, silicon nitride, silicon oxynitride, silicon nitride oxide, for example, and can be formed by applying a chemical vapor deposition (CVD) method, a sputtering method, and the like. In FIG. 11A, an example is illustrated in which the undercoat film 510 has a three-layer structure. In this case, the undercoat film 510 may be formed by stacking a silicon oxide film, a silicon nitride film, and a silicon oxide film in this order, for example. The silicon oxide film in the lowest layer is disposed to increase adhesion with the base substrate 500, the silicon nitride film in the middle layer is arranged as a blocking film to prevent entrance of an impurity such as water from outside, and the silicon oxide layer in the upmost layer is formed as a blocking film to prevent dispersion of a hydrogen atom included in the silicon nitride film to the transistors. The structure of the undercoat film 510 is not limited this structure. Another layer may be additionally stacked, and the undercoat film 510 may be a single layer or have two stacked layers.

Figure 11B:
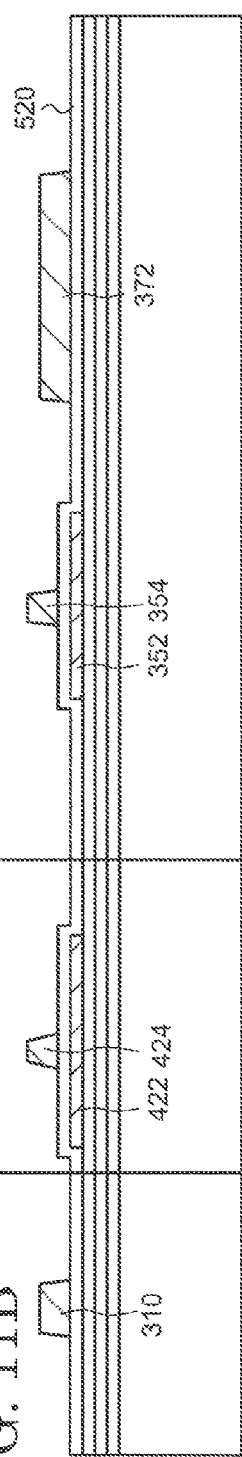

The transistor 420 included in the shift register 410, transistors 340, 350, and 360, the capacitor 370, and the supplement capacitor 380 included in the pixel 400, and the like are formed over the undercoat layer 510. Specifically, as shown in FIG. 11B, the semiconductor films 422 and 352 are formed over the undercoat layer 510. These semiconductor films 422 and 352 can be formed with silicon, a metal oxide exhibiting a semiconductor property, and the like by applying a CVD method, a sputtering method, and the like. The crystallinity of the semiconductor films 422 and 352 is not limited, and the semiconductor films 422 and 352 may possess any of the crystal states including an amorphous state, a polycrystal, state, a microcrystal state, and a single crystal state.

The gate insulating film 520 is formed over the semiconductor films 422 and 352. An inorganic compound such as silicon oxide, silicon nitride, silicon oxynitride, and silicon nitride oxide can be used for the gate insulating film 520, and the gate insulating film 520 can be formed by applying a CVD method, a sputtering method, and the like. The gate insulating film 520 is also formed in the cross-section G-H in which no element such as a transistor is fabricated.

After that, the films existing in the same layer as the gate line 310, specifically, the gate 424 of the transistor 420, the gate 354 of the transistor 350, and the electrode 372 of the capacitor 370 are formed. These films can be formed with a metal or an alloy by applying a sputtering method and the like. As a metal, aluminum, copper, titanium, tungsten, molybdenum, tantalum, and the like can be used, and the films can be formed so as to have a single layer structure or a stacked layer structure. For example, it is possible to employ a stack of titanium and aluminum or a structure in which a metal with a high conductivity such as aluminum and copper is sandwiched between metals with a high melting point such as titanium and molybdenum. If necessary, a source/drain region and a channel region may be formed by doping an impurity to the semiconductor films 422 and 352 with the gates 424 and 354 as a mask. Additionally, a region (low concentration impurity region) in which the impurity is doped at a concentration lower than that of the source/drain region may be formed between the channel region and the source/drain region.

Figure 11C:
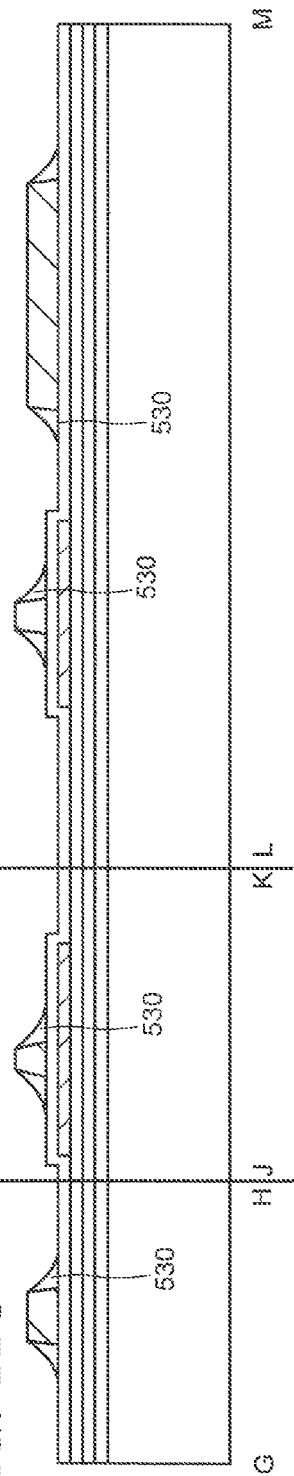

Next, the sidewall 530 is formed by using an organic material so as to cover the side surfaces of the gate 424, the gate 354, the gate line 310, and one of the electrodes of the capacitor 370 (FIG. 11C). As the organic material, a polymer material such as an acrylic resin, a polyester, a polyimide, a polysiloxane, and a polycarbonate can be employed. Alternatively, a low-molecular weight material having a molecular weight from approximately 300 to 1000 can be used. The sidewall 530 is formed with these materials by utilizing a wet film-formation process such as a spin-coating method, a printing method, and an ink-jet method or a dry film-formation method such as an evaporation method. For example, the sidewall 530 can be formed by forming an organic material over the whole of the substrate, and then a part of the organic material is removed by etching. More specifically, the sidewall 530 having the configuration described in Embodiment 1 can be formed by performing etching for a time which is shorter than a time required to completely remove the aforementioned organic material.

After that, the protection film 540 is formed (FIG. 12A). The protection film 540 can be formed as a single layer structure or a stacked layer structure by adopting the material usable for the undercoat film 510 and the gate insulating film 520. For example, the protection film 540 may be formed as a stacked structure of a silicon nitride film and a silicon oxide film.

Next, the signal line 320 and the films existing in the same layer as the signal line 320 are formed. Specifically, the signal line 320, the source 426 and the drain 428 of the transistor 420, the source 356 and the drain 358 of the transistor 350, and the other electrode 374 of the capacitor 370 are formed (FIG. 12A). These items can be formed, for example, with the material usable for the gate line 310 by applying a CVD method, a sputtering method, and the like. For example, a stacked structure in which an aluminum film is sandwiched by titanium films can be employed. By this process, the transistor 420, the transistor 350, the capacitor 370, the other transistors 360 and 380 included in the pixel 400, and the like are formed. Note that the wiring 150 shown in FIG. 1 may be formed by the films existing in the same layer as the signal layer 320.

As mentioned above, the formation of the sidewall 530 to cover the side surface of the gate line 310, for example, enables it to relax the steps generated in the protection film 540 and the signal line 320 which are formed over the gate line 310.

Next, the interlayer insulating film 550 is formed by using a polymer material such as an acrylic resin, a polyimide, and a polysiloxane (FIG. 12B). The interlayer insulating film 550 can be formed by a spin-coating method, an ink-jet method, a printing method, a dip-coating method, and the like. By this process, the unevenness caused by the transistor 420, the transistor 360, the capacitor 370, and the like is absorbed, resulting in a flat surface.

Next, the opening portion is formed by removing a part of the interlayer insulating film 550 by applying dry etching or wet etching so that a part of the drain 358 of the transistor 350 is exposed (FIG. 12B). Sequentially, the connection electrode 560 and the power source line 430 are formed so as to cover the opening portion (FIG. 13A). The connection electrode 560 and the power source line 430 can be formed, for example, with a conductive oxide having a light-transmitting property, such as indium-tin oxide (ITO) and indium-zinc oxide (IZO), by applying a sputtering method and the like. Therefore, the power source line 430 and the connection electrode 560 exist in the same layer. Note that, at this time, the interlayer insulating film 550 over the terminals 170 shown in FIG. 1 is simultaneously removed, and the conductive oxide having a light-transmitting property is formed over the exposed terminals 170. This process allows a stable electrical connection with a connector in the terminals 170.

Next, the wire 386 and the electrode 382 are formed by using a metal such as aluminum, copper, titanium, molybdenum, tungsten, and tantalum or an alloy thereof (FIG. 13A). As the wire 386 and the electrode 382, a stacked structure of molybdenum/aluminum/molybdenum can be used, for example. The wire 386 is electrically connected to the power source line 430, and the electrode 382 forms the supplement capacitor 380 with the first electrode 392 of the light-emitting element 390 formed later. Note that, although the connection electrode 560 is not necessarily disposed, the arrangement of the connection electrode 560 allows the drain 358 of the transistor 350 to be protected in the formation of the wire 386 and the electrode 382, by which an increase in the contact resistance can be prevented.

After that, the insulating film 570 is formed (FIG. 13B). The insulating film 570 can be formed by using a material such as silicon nitride which can be used in the gate insulating film 520 and the protection film 540. The insulating film 570 has a contact portion for the electrical contact of the transistor 350 with the light-emitting element 390 (i.e., a bottom surface of the connection electrode 560 formed in the opening portion of the interlayer insulting film 550), the opening portion to expose the power source line 430, and the opening portion 580 to expose a part of the surface of the interlayer insulating film 550.

Next, the first electrode 392 of the light-emitting element 390 is formed (FIG. 13B). When the emission from the light-emitting element 390 is extracted through the base substrate 500, a material having a light-transmitting property, which is exemplified by a conductive oxide such as ITO and IZO, can be used for the first electrode 392. On the other hand, when the emission from the light-emitting element 390 is extracted from the side opposite to the base substrate 500, a metal such as aluminum and silver or an alloy thereof can be used. Alternatively, a stacked layer of the aforementioned metal or alloy with the conductive oxide, for example, a stacked structure in which a metal is sandwiched between a conductive oxide (e.g., ITO/silver/ITO etc.) can be employed. As described above, the supplement capacitor 380 is formed by the first electrode 392, the electrode 382, and the insulating film 570 sandwiched therebetween.

After the formation of the first electrode 392, the partition wall 590 is formed (FIG. 14A). The partition wall 590 absorbs the steps caused by the edge portion of the first electrode 392 and the opening portion formed in the interlayer insulating film 550 and has a function to electrically insulate the first electrodes 392 of the adjacent pixels 400 from each other. The partition wall 590 is also called a bank (rib). The partition wall 590 can be formed with the material which can be used for the interlayer insulating film 550. The partition wall 590 has the opening portion to expose a part of the first electrode 392 and a part of the power source lines 430, and it is preferred that the edge of the opening portion have a taper shape with a moderate incline. A steep incline at the edge of the opening portion with respect to the first electrode 392 could readily cause a coverage defect of the organic layer 394 and the second electrode 398 formed later.

Here, the interlayer insulating film 550 and the partition wall 590 are in contact with each other through the opening portion 580 provided in the insulating film 570 located therebetween. The application of such a structure allows gas such as water, which is eliminated from the interlayer insulating film 550 in the heating treatment and the like after the formation of the partition wall 590, to be released through the partition wall 590.

After the formation of the partition wall 590, the organic layer 394 of the light-emitting element 390 is formed (FIG. 14B). Although the cross-sectional view L-M of FIG. 14B shows a configuration in which the organic layer 394 has three layers of the first layer 395, the second layer 396, and the third layer 397, the present embodiment is not limited thereto, and the organic layer 394 having a single layer structure or a structure having four or more layers may be used. For example, a charge-blocking layer, an exciton-blocking layer, and the like can be used as appropriate. The organic layer 394 can be formed by an evaporation method, an ink-jet method, a printing method, a spin-coating method, and the like.

In FIG. 14B, the first layer 395 and the third layer 397 of the organic layer 394 are a charge injection/transportation layer and are formed so as to extend over the adjacent pixels 400. That is, they are shared by the plural pixels 400. Therefore, as shown in the cross-section G-H, the first layer 395 and the third layer 397 are formed in a region which overlaps with the signal line 320. On the contrary, the second layer 396 is an emission layer and can have a material or a structure different between pixels 400. Hence, it is possible to obtain different colors from the adjacent pixels 400, by which a full color display can be realized. However, the second layer 396 may be formed so as to have a white-emissive structure shared by all pixels 400. In this case, a full color display can be performed by selecting a wavelength of the light extracted from each pixel 400 by using color filters.

After forming the organic layer 394, the second electrode 398 is formed. The light-emitting element 390 is structured by the first electrode 392, the organic layer 394, and the second electrode 398. Carriers (electrons and holes) are injected into the organic layer 394 from the first electrode 392 and the second electrode 394, and emission is obtained through a relaxation process to a ground state from an excited state obtained by the carrier recombination. Therefore, a region in which the organic layer 394 and the first electrode 392 are in direct contact with each other is an emission region in the light-emitting element 390.

When the emission from the light-emitting element 390 is extracted through the base substrate 500, a metal such as aluminum and silver or an alloy thereof can be used as the second electrode 398. On the other hand, when the emission from the light-emitting element 390 is extracted through the second electrode 398, the second electrode 398 is formed by using the aforementioned metal or alloy so as to have a thickness which allows visible light to pass through. Alternatively, a material having a light-transmitting property, which is exemplified by a conductive oxide such as ITO and IZO, can be used for the second electrode 398. Furthermore, a stacked structure of the aforementioned metal and alloy with a conductive oxide (e.g., Mg—Ag/ITO etc.) can be employed for the second electrode 398. The second electrode 398 is formed so as to overlap with the signal line 320 and be in contact with the power source line 430 (see the cross-sections G-H and J-K). The power source line 430 is electrically connected to the terminal (terminals 170 in FIG. 1) finally.

After the formation of the second electrode 398, the protection film 600 (passivation film) is formed (FIG. 14B). One of the functions of the protection film 600 is to prevent the entrance of water from outside to the light-emitting element 390 prepared beforehand, and the protection film 600 preferably has a high gas-barrier property. For example, it is preferred to form the protection film 600 by using an inorganic material such as silicon nitride, silicon oxide, silicon nitride oxide, and silicon oxynitride. Alternatively, an organic resin including an acrylic resin, a polysiloxane, a polyimide, or a polyester may be used. For example, a stacked structure of a film formed with an inorganic material and a film formed with an organic resin may be employed. Specifically, a stacked structure of silicon nitride, silicon oxide, an acrylic resin, and silicon nitride is exemplified. Each of these layers can be formed by applying an evaporation method, a CVD method, a sputtering method, and the like.

As an optional structure, the opposing substrate may be disposed over the protection film 600. The opposing substrate is fixed, by using an adhesion, to the base substrate 500 through the protection film 600. At this time, a space between the opposing substrate and the protection film 600 may be filled with an inert gas or a fill material such as a resin. In the case of using a fill material, the fill material preferably has a high light-transmitting property. A light-shielding film having an opening in a region overlapping with the emission region and a color filter in a region overlapping with the emission region may be provided to the opposing substrate. The light-shielding film is formed by using a metal having a relatively low reflectance, such as chromium and molybdenum, or a mixture of a resin material with a coloring material having a black or similar color. The light-shielding film has a function to shield or suppress the scattering or reflection of external light other than the light directly obtained from the emission region. The color filter can be formed while changing its optical property between the adjacent pixels 400 so that red emission, green emission, and blue emission are extracted. The light-shielding film and the color filter may be provided over the opposing substrate with an undercoat film interposed therebetween, and an overcoat layer may be further arranged to cover the light-shielding film and the color filter.

When the opposing substrate is fixed to the base substrate 500, the opposing substrate and the base substrate 500 are sealed with an adhesion disposed in a periphery of the display region 120 so that the light-emitting element 390 is sandwiched between the opposing substrate and the base substrate 500. At this time, a gap may be adjusted by including a spacer in the adhesion because a strong contact of the opposing substrate with the base substrate 500 results in damage of the organic layer 394, leading to a short circuit between the first electrode 392 and the second electrode 398. Alternatively, a structure functioning as a spacer may be formed between the pixels 400 in the display region 120.

In the display device 300 of the present embodiment, the sidewall 500 is formed to cover the side surfaces of the gate line 310, the gate 354 of the transistor 350, the gate 424 of the transistor 420, and the electrode 372 of the capacitor 370, which exist in the same layer as the gate line 310. As described in Embodiment 1, the formation of the sidewall 530 permits the configuration change of the protection film 540 and the signal line 320 to be relaxed and the strain caused by the bend to be delocalized. By this structure, the disconnection of the signal line 320 can be suppressed, and peeling of the signal line 320 and the protection film 540 can be prevented. Accordingly, a flexible display device having high reliability can be supplied.

The aforementioned modes described as the embodiments of the present invention can be implemented by being appropriately combined with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of a flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
   a first wiring over an insulating surface;
   a sidewall over the insulating surface and covering a side surface of the first wiring;
   an insulating film over the first wiring and the sidewall; and
   a second wiring over the insulating film, the second wiring extending in a direction which intersects with the first wiring,
   wherein an angle of a surface of the sidewall with respect to the insulating surface is smaller than an angle of the side surface of the first wiring with respect to the insulating surface,
   an intersection portion of the first wiring and the second wiring is located in or outside of a display region of the display device, and
   the display device is configured to be bent so that the first wiring is bent and a bent portion of the display device includes the intersection portion.

2. The display device according to claim 1,
   wherein the angle of the surface of the sidewall with respect to the insulating surface increases with decreasing distance from the first wiring.

3. The display device according to claim 1,
   wherein the second wiring intersects with the first wiring substantially perpendicularly.

4. The display device according to claim 1, wherein the insulating film includes an inorganic compound, and the sidewall includes an organic compound.

5. A display device comprising:
   a display region comprising a plurality of pixels, the display region comprising:

a gate line over an insulating surface;

a sidewall over the insulating surface and covering a side surface of the gate line; and a signal line crossing over the gate line and the sidewall with an insulating film interposed between the signal line and the gate line and between the signal line and the sidewall, wherein an angle of a surface of the sidewall with respect to the insulating surface is smaller than an angle of the side surface of the gate line with respect to the insulating surface, the display device is configured to be bent so that the gate line is bent, and a bent portion of the display device includes an intersection portion of the gate line with the signal line.

6. The display device according to claim 5, wherein the angle of the surface of the sidewall with respect to the insulating surface increases with decreasing distance from the gate line.

7. The display device according to claim 5, wherein the insulating film includes an inorganic compound, and the sidewall includes an organic compound.

8. A display device comprising:

a display region over an insulating surface, the display region comprising:

a gate line;

a first sidewall covering a side surface of the gate line;

a signal line crossing over the gate line and the first sidewall with an insulating film interposed between the signal line and the first sidewall and between the signal line and the gate line; and a light-emitting element electrically connected to the gate line and the signal line; and a driver circuit electrically connected to the display region, the driver circuit comprising:

a transistor comprising a gate, a source, and a drain;

a first wiring electrically connected to the gate line;

the insulating film over the gate; and a second wiring over the insulating film, the second wiring being electrically connected to one of the source and the drain and intersecting with the first wiring substantially perpendicularly, wherein an angle of a surface of the first sidewall with respect to the insulating surface is smaller than an angle of the side surface of the gate line with respect to the insulating surface, the display device is configured to be bent so that the gate line is bent, and a bent portion of the display device includes an intersection portion of the gate line with the signal line or a region between the display region and the driver circuit.

9. The display device according to claim 8, wherein the angle of the surface of the first sidewall with respect to the insulating surface increases with decreasing distance from the gate line.

10. The display device according to claim 8, further comprising a reference power source line, wherein the bent portion includes an intersection portion of the gate line with the reference power source line.

11. The display device according to claim 8, wherein the driver circuit further comprises a second sidewall covering a side surface of the first wiring, and an angle of a surface of the second sidewall with respect to the insulating film is smaller than an angle of the side surface of the first wiring with respect to the insulating surface.

12. The display device according to claim 11, wherein the angle of the side surface of the second sidewall with respect to the insulating surface increases with decreasing distance from the gate line.

13. The display device according to claim 11, wherein the display device is configured to be bent so that the first wiring is bent, and a bent portion of the display device includes an intersection portion of the first wiring with the second wiring.

14. The display device according to claim 8, wherein the insulating film includes an inorganic compound, and the first sidewall includes an organic compound.

15. The display device according to claim 11, wherein the second sidewall includes an organic compound.

* * * * *